US010462949B2

(12) United States Patent
Ohashi et al.

(10) Patent No.: US 10,462,949 B2
(45) Date of Patent: Oct. 29, 2019

(54) REEL HOLDING DEVICE

(71) Applicant: FUJI CORPORATION, Chiryu-shi (JP)

(72) Inventors: Hiroyasu Ohashi, Toyota (JP); Takuya Nagaishi, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 141 days.

(21) Appl. No.: 15/554,605

(22) PCT Filed: Mar. 3, 2015

(86) PCT No.: PCT/JP2015/056149
§ 371 (c)(1),
(2) Date: Aug. 30, 2017

(87) PCT Pub. No.: WO2016/139741
PCT Pub. Date: Sep. 9, 2016

(65) Prior Publication Data
US 2018/0146581 A1    May 24, 2018

(51) Int. Cl.
*H05K 13/08* (2006.01)
*H05K 13/04* (2006.01)
(Continued)

(52) U.S. Cl.
CPC ......... *H05K 13/0417* (2013.01); *B65H 75/44* (2013.01); *H05K 13/021* (2013.01); *H05K 13/0419* (2018.08); *H05K 13/08* (2013.01)

(58) Field of Classification Search
CPC .. H05K 13/08; H05K 13/021; H05K 13/0417; H05K 13/0419; B65H 75/44
See application file for complete search history.

(56) References Cited

U.S. PATENT DOCUMENTS

2014/0267682 A1* 9/2014 Youngquist ........ H05K 13/0417
348/87
2014/0270473 A1* 9/2014 Youngquist ........ H05K 13/0408
382/147

(Continued)

FOREIGN PATENT DOCUMENTS

JP   2001-251092 A   9/2001
JP   2008-85141 A    4/2008
JP   2013-235900 A   11/2013

OTHER PUBLICATIONS

International Search Report dated May 19, 2015 in PCT/JP2015/056149.

*Primary Examiner* — Sang K Kim
(74) *Attorney, Agent, or Firm* — Oblon, McClelland, Maier & Neustadt, L.L.P.

(57) ABSTRACT

A reel holding device is provided. The device includes: a case which accommodates the plurality of component supply reels to be aligned in a direction of a reel axial line; outer circumferential support members which are built between two sides walls of the case, and support outer circumferences of the multiple component supply reels to be rotatable; and a deviation preventing member which prevents the component supply reels from deviating from the outer circumferential support members. At least one of the outer circumferential support members and the deviation preventing member is an integrated rod-like member which is built between the two side walls.

5 Claims, 6 Drawing Sheets

(51) Int. Cl.
 B65H 75/44 (2006.01)
 H05K 13/02 (2006.01)

(56) References Cited

U.S. PATENT DOCUMENTS

2014/0271082 A1* 9/2014 Youngquist ........ H05K 13/0417
 414/749.1
2014/0277680 A1* 9/2014 Youngquist .......... B23K 26/352
 700/121

* cited by examiner

REEL HOLDING DEVICE

TECHNICAL FIELD

The present disclosure relates to a reel holding device which is used being combined with a feeder device provided in a component mounting machine, and which holds a component supply reel around which a component storage tape is wound to be rotatable.

BACKGROUND ART

As facilities which produce boards on which multiple components are mounted, there are a solder printing machine, a component mounting machine, a reflow machine, and a board inspection machine. It is general to configure a board production line that links the facilities to each other. The component mounting machine includes a board conveyance device, a component supply device, a component transfer device, and a control device. As a representative example of the component supply device, there is a feeder device which sends out the component storage tape which stores components in each of multiple component storage sections. A reel holding device which is combined with the feeder device, and holds a component supply reel around which the component storage tape is wound to be rotatable and exchangeable, is used. An example of the related art related to this type of reel holding device is disclosed in PTL 1.

The component supply device of PTL 1 includes a first reel holding section which can hold multiple first reels having a narrow width corresponding to a first feeder group, and a second reel holding section which can hold a second reel having a wide width corresponding to a second feeder group. Furthermore, the second reel holding section includes one pair of rollers which are disposed to be rotatable around a rotation axial line in a width direction, and a width-direction regulating section in which multiple partition sections that protrude in the direction orthogonal to the width direction are aligned. In addition, the second reel holding section holds the second reel in a state of being placed on one pair of rollers while inserting the second reel into a partition space between the partition sections. According to this, while the multiple feeders are installed in the first and second feeder groups in a compact state, it is possible to excellently use both of the first and second reels having different widths from each other without interrupting each other.

CITATION LIST

Patent Literature

PTL 1: JP-A-2008-85141

SUMMARY

However, in the reel holding device of the related art starting from PTL 1, one pair of rollers support an outer circumference of the reel. In addition, not only a narrow width dimension of a roller that corresponds to one reel, but also a wide width dimension that collectively supports multiple reels, can be employed. However, in this configuration, there is a concern that a reel flange which forms the reel is meshed between the roller and a case side wall or between the rollers. When the reels are meshed and free rotation becomes impossible, sending of a component storage tape is interrupted and a component supply action is obstructed.

Considering the problem of the above-described related art, an object of the present disclosure is to provide a reel holding device which holds a component supply reel to be stably rotatable and reliably sends out a component storage tape.

In order to solve the above-described problem, there is provided a reel holding device of the present disclosure which is used being combined with a feeder device that is capable of collecting components at a supply position by sending out a component storage tape which stores each of the components in a plurality of component storage sections, and holds a plurality of component supply reels around which the component storage tapes are respectively wound to be rotatable and exchangeable, the device including: a case which accommodates the plurality of component supply reels to be aligned in a direction of a reel axial line; outer circumferential support members which are built between two sides walls of the case, and support outer circumferences of the plurality of component supply reels to be rotatable such that the reel axial lines are identical to each other; and a deviation preventing member which is built between the two side walls, faces the outer circumferences of the plurality of component supply reels, and prevents the component supply reels from deviating from the outer circumferential support members, in which at least one of the outer circumferential support members and the deviation preventing member is an integrated rod-like member which has a smooth surface that abuts against the outer circumferences of the plurality of component supply reels and is built between the two side walls.

According to the reel holding device of the present disclosure, at least one of the outer circumferential support members and the deviation preventing member is an integrated rod-like member which is built between two side walls. Therefore, the multiple component supply reels abut against the outer circumference of the integrated rod-like member, and there is no concern that the reel flange is meshed between the rollers unlike the related art. Therefore, the reel holding device holds the component supply reel to be stably rotatable, and reliably sends out the component storage tape.

DESCRIPTION OF EMBODIMENTS (1. Configuration of Reel Holding Device 1 of First Embodiment)

Figure 1:
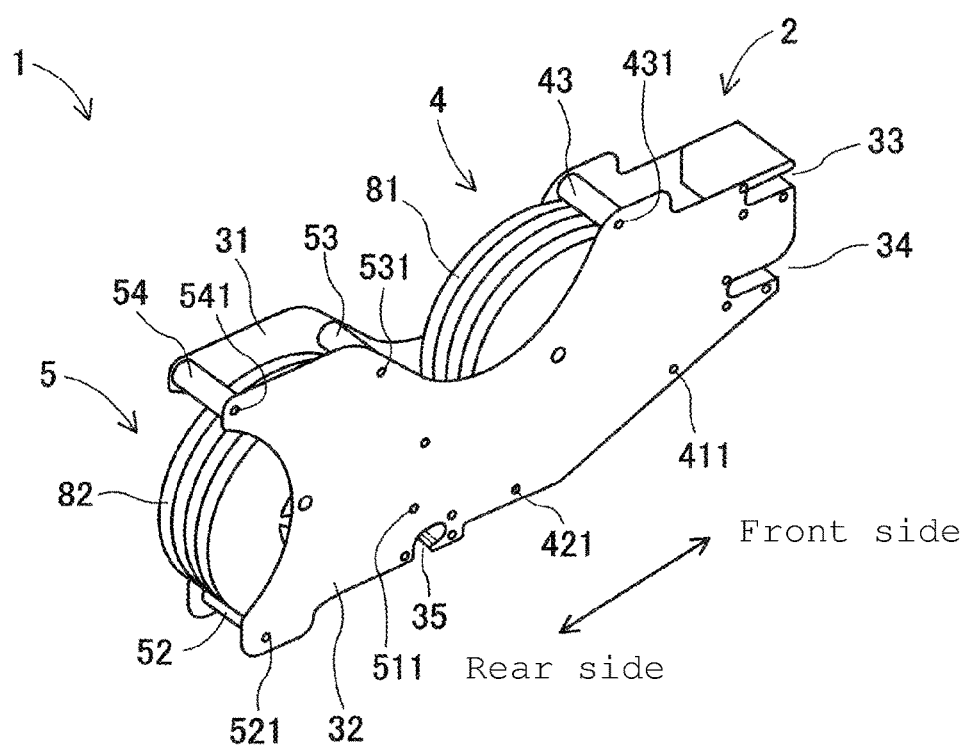
FIG. 1 is a perspective view illustrating a configuration of a reel holding device of a first embodiment.
Figure 2:
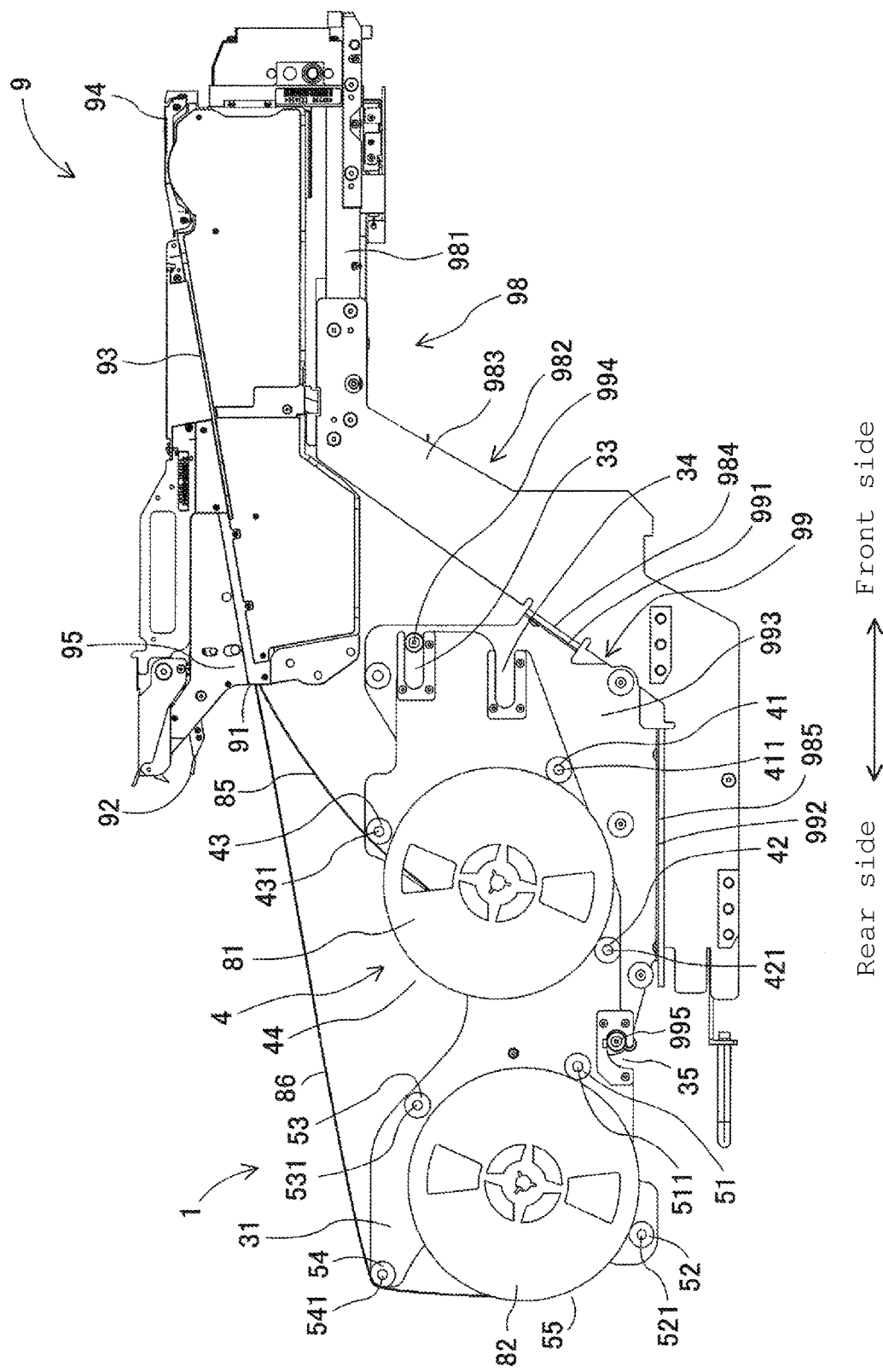
FIG. 2 is a side view illustrating a use state where the reel holding device of the first embodiment is combined with a feeder device.

A configuration of a reel holding device 1 of a first embodiment of the present disclosure will be described with reference to FIGS. 1 and 2. The reel holding device 1 is equipped with a feeder device 9 and a component mounting machine, and plays a role of supplying components. FIG. 1 is a perspective view illustrating a configuration of the reel holding device 1 of the first embodiment. In FIG. 1, a front side (far right side of a paper surface) of the reel holding device 1 is disposed to oppose the feeder device 9. FIG. 2 is a side view illustrating a use state where the reel holding device 1 of the first embodiment is combined with the feeder device 9. As illustrated in FIG. 2, the reel holding device 1 is disposed on a rear lower side of the feeder device 9. The reel holding device 1 is configured of a case 2, a first reel holding section 4, a second reel holding section 5 and the like.

The case 2 is formed to be coupled such that two side walls 31 and 32 which are long in the front-back direction are disposed to be separated from each other in parallel. In FIG. 2, the side wall 32 on a near front side is not illustrated. The first reel holding section 4 is provided to be near a front side of an inner space between the two side walls 31 and 32, and the second reel holding section 5 is provided to be near a rear side of the inner space. The separation distance of the two side walls 31 and 32 is set in accordance with the number of component supply reels 81 and 82 accommodated in the first reel holding section 4 and the second reel holding section 5. In the embodiment, in the first reel holding section 4 and the second reel holding section 5, four component supply reels 81 and 82 are respectively accommodated to be aligned in the direction of the reel axial line.

At the upper part of the front end of the case 2, an upper mounting groove 33 which extends in the front-back direction is formed. At the lower part of the front end of the case 2, a lower mounting groove 34 which extends in the front-back direction is formed. Furthermore, a hook-like bottom section mounting groove 35 is formed to be near the rear side of the bottom section of the case 2. The upper mounting groove 33 and the bottom section mounting groove 35 are used when the reel holding device 1 is mounted on a common pallet 98 which will be described later. The lower mounting groove 34 is used together with the upper mounting groove 33 for an additional use, for example, in a case of being maintained at a storage place considering the front side of the reel holding device 1 as a lower side.

The first reel holding section 4 is configured to include two outer circumferential support rollers 41 and 42 and one deviation preventing roller 43. As illustrated in FIG. 2, the two outer circumferential support rollers 41 and 42 are disposed to be longitudinally separated from each other near the lower part of the first reel holding section 4. The deviation preventing roller 43 is disposed on the front side near the upper part of the first reel holding section 4. The outer circumferential support rollers 41 and 42 and the deviation preventing roller 43 are cylindrical members which are long in the direction of each of the reel axial lines. The outer circumferential support rollers 41 and 42 and the deviation preventing roller 43 are being supported to be freely rotatable around shaft members 411, 421, and 431 which are respectively built between the two side walls 31 and 32.

The separation distance between the front and rear outer circumferential support rollers 41 and 42 is smaller than the outer diameter of the component supply reel 81. Therefore, the front and rear outer circumferential support rollers 41 and 42 support the outer circumference of four component supply reels 81 to be rotatable and prevents the component supply reels from being dropped. A slight void is generated between the outer circumference of the component supply reel 81 supported by the front and rear outer circumferential support rollers 41 and 42 and the deviation preventing roller 43.

The separation distance between the front outer circumferential support roller 41 and the deviation preventing roller 43 is smaller than the outer diameter of the component supply reel 81. Accordingly, deviation of the component supply reel 81 to the front side is prevented. The separation distance between the rear outer circumferential support roller 42 and the deviation preventing roller 43 is greater than the outer diameter of the component supply reel 8. Therefore, the component supply reel 81 can be put in between the rear outer circumferential support roller 42 and the deviation preventing roller 43 diagonally from the upper part of the rear part. In other words, a reel putting-in/out section 44 is formed between the outer circumferential support roller 42 and the deviation preventing roller 43.

The second reel holding section 5 is positioned at the rear part of the first reel holding section 4. The second reel holding section 5 is configured to include two outer circumferential support rollers 51 and 52, a deviation preventing roller 53, and a tape guide roller 54. As illustrated in FIG. 2, the two outer circumferential support rollers 51 and 52 are disposed to be longitudinally separated from each other near the lower part of the second reel holding section 5. The deviation preventing roller 53 is disposed on the front side near the upper part of the second reel holding section 5. The tape guide roller 54 is disposed on the rear side near the upper part of the second reel holding section 5. Each of the rollers 51 to 54 is respectively a cylindrical member which is long in the axial line direction. Each of the rollers 51 to 54 is supported to be freely rotatable around shaft members 511, 521, 531, and 541 which are respectively built between the two side walls 31 and 32.

The separation distance between the front and rear outer circumferential support rollers 51 and 52 is smaller than the outer diameter of the component supply reel 82. Therefore, the front and rear outer circumferential support rollers 51 and 52 support the outer circumference of four component supply reels 82 to be rotatable and prevents the component supply reels from being dropped. The separation distance between the front outer circumferential support roller 51 and the deviation preventing roller 53 is smaller than the outer diameter of the component supply reel 82. Accordingly, the component supply reel 82 is prevented from being deviated to the front part and from interrupting the front component supply reel 81. The separation distance between the rear outer circumferential support roller 52 and the tape guide roller 54 is greater than the outer diameter of the component supply reel 82. Accordingly, it is possible to put in the component supply reel 82 between outer circumferential support roller 52 and the tape guide roller 54 from the rear part, and the reel putting-in/out section 55 is formed therebetween.

Here, the four outer circumferential support rollers 41, 42, 51, and 52, and the two deviation preventing rollers 43 and 53 correspond to the integrated rod-like member of the present disclosure, and correspond to the freely rotatable rod-like roller member of the present disclosure. Furthermore, members having the same shape are used as the four outer circumferential support rollers 41, 42, 51, and 52, the two deviation preventing rollers 43 and 53, and the tape guide roller 54. Similarly, members having the same shape are also used as the shaft members 411, 421, 511, 521, 431, 531, and 541 which support the rollers 41, 42, 51, 52, 43, 53, and 54. Hereinafter, a specific shape will be described by selecting the deviation preventing roller 43 and the shaft member 431 of the first reel holding section 4 as a representative member having the same shape.

(2. Specific Shape of First Reel Holding Section 4)

Figure 3:
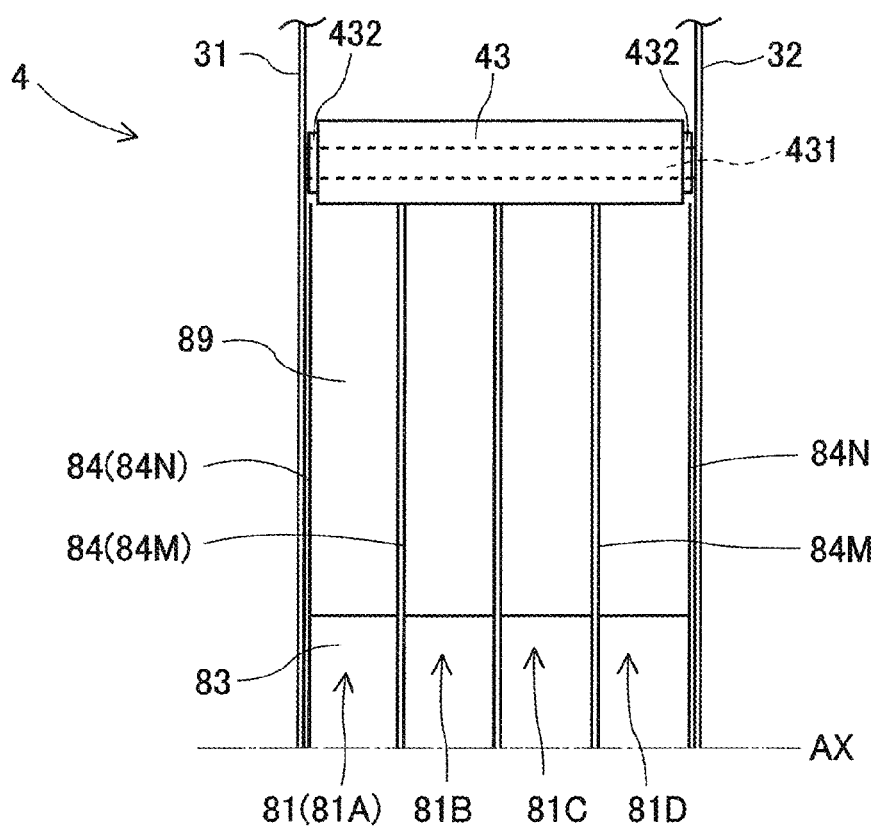
FIG. 3 is a plan view when a first reel holding section is viewed from above.
Figure 4:
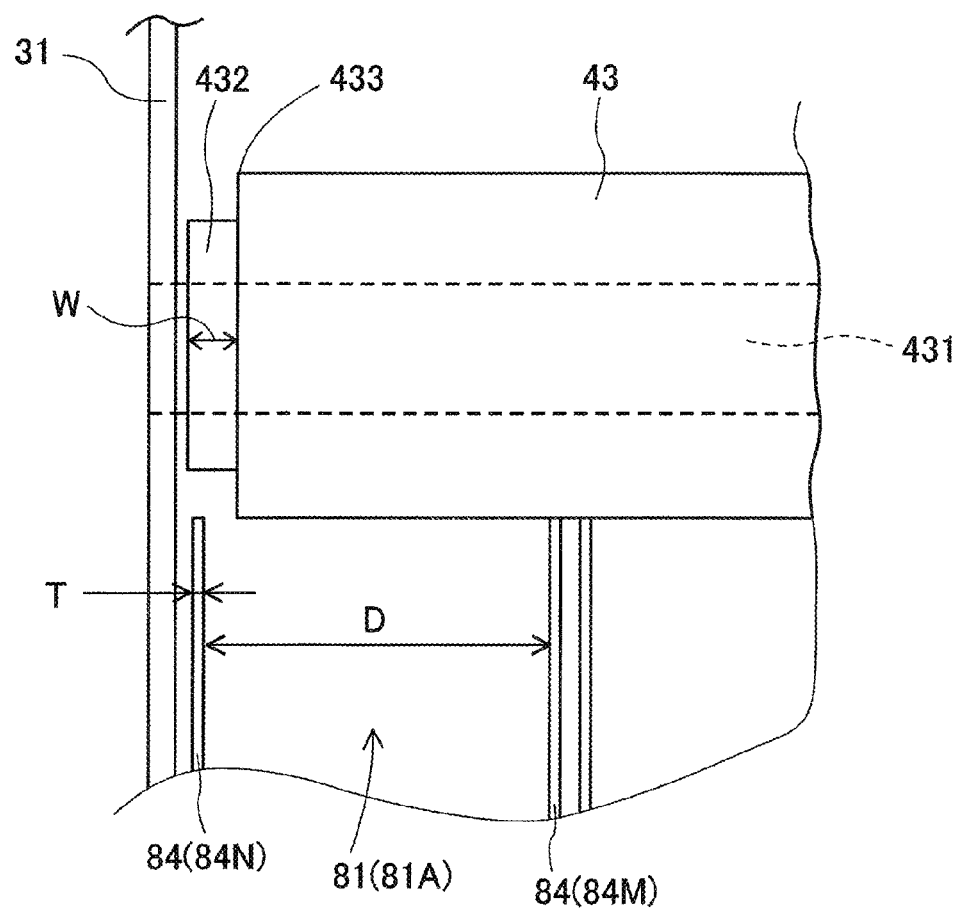
FIG. 4 is an enlarged plan view illustrating a structure in the vicinity of a diameter-reducing section of a deviation preventing roller.

FIG. 3 is a plan view when the first reel holding section 4 is viewed from above. The deviation preventing roller 43 supported by the shaft member 431 has diameter-reducing sections 432 at both of the end parts respectively. Since an outer circumferential surface except for the diameter-reducing section 432 of the deviation preventing roller 43 abuts against the outer circumference of the component supply reel 81, the outer circumferential surface can be made as a smooth cylindrical surface. FIG. 4 is an enlarged plan view illustrating a structure in the vicinity of the diameter-reducing section 432 of the deviation preventing roller 43. As illustrated in FIG. 4, the diameter-reducing sections 432 are formed on both sides of a step section 433 at which the outer diameter of the roller suddenly becomes small. Not being limited thereto, the diameter-reducing section 432 may have a tapered shape of which the outer diameter of the roller gradually becomes small, or a round chamfered shape obtained by performing chamfering processing with respect to the end part of the roller.

As illustrated in FIG. 3, the component supply reels 81 are formed to be substantially rotational symmetric to each other around a reel axial line AX. The component supply reels 81 are formed as disk-like reel flanges 84 having a large diameter are respectively fixed to both end surfaces of cylindrical reel axis 83 having a small diameter. Although not illustrated in FIG. 3, a component storage tape 85 is wound around a space 89 around the reel axis 83 between two reel flanges 84. As illustrated in FIG. 4, a thickness of reel flange 84 is T and a separation distance between two reel flanges 84 is D.

A width dimension W in the reel axial line AX direction of the diameter-reducing section 432 of the deviation preventing roller 43 is wider than the thickness T of the reel flange 84, and is narrower than the separation distance D between two reel flanges 84. Therefore, in two component supply reels 81B and 81C near the center in the reel axial line direction, two reel flanges 84 can commonly abut against the deviation preventing roller 43. Meanwhile, in two component supply reels 81A and 81D near the end part in the reel axial line direction, a reel flange 84M at the center can abut against the deviation preventing roller 43, but cannot abut against the deviation preventing roller 43 since a reel flange 84N on the end part side faces the diameter-reducing section 432.

(3. Use Method of Reel Holding Device 1)

Next, a use method of the reel holding device 1 will be described together with a configuration of the common pallet 98 and the feeder device 9. As illustrated in FIG. 2, the reel holding device 1 is used being mounted on the common pallet 98 together with the feeder device 9. The common pallet 98 is installed to be attachable to and detachable from the component mounting machine which is not illustrated. Not being limited thereto, the common pallet 98 may be fixedly installed in the component mounting machine. The common pallet 98 is configured of a feeder mounting section 981 and a reel mounting section 982. The feeder mounting section 981 is formed as an erect part is provided on the front side of a substantially rectangular plane part, and has a substantially L shape when viewed from the side. At the flat surface section of the feeder mounting section 981, slots which are not illustrated and extend in the front-back direction are engraved to be aligned in the width direction. The multiple feeder devices 9 which are thin in the width direction are respectively inserted toward a front vertical part from the rear part of the slots, and are mounted thereon.

The feeder device 9 has a tape insertion port 91 in the vicinity of a medium-height part of the rear end, and has an insertion lever 92 near the upper part of the rear end. By lifting up the insertion lever 92, it is possible to insert first and second component storage tapes 85 and 86 into the tape insertion port 91 in order. A feeding rail 93 is installed toward the upper part of the front end from the tape insertion port 91 of the feeder device 9. On an upper face in the vicinity of the front end of the feeding rail 93, a supply position 94 is set.

Above the vicinity of the rear end of the sending-out rail 93, a tape control section 95 is provided. The tape control section 95 allows the sending of the inserted first component storage tape 85, and makes the inserted second component storage tape 86 on standby. In addition, when the first component storage tape 85 is not provided, the tape control section 95 automatically allows the sending of the second component storage tape 86. Therefore, the splicing work of connecting the first and second component storage tapes 85 and 86 becomes unnecessary. A specific configuration of the tape control section 95 is disclosed, for example, in JP-A-2014-82454. The feeder device 9 is provided with a tape feeding mechanism which is not illustrated and is configured of a servomotor or a sprocket or the like, and sends out the component storage tapes 85 and 86 to the supply position 94 along the feeding rail 93.

The reel mounting section 982 of the common pallet 98 is configured of two arm members 983, a front bridge plate 984, and a rear bridge plate 985 and the like. One or multiple attachment devices 99 are fixed to the reel mounting section 982. Specifically, the two arm members 983 are respectively fixed to the rear parts on both sides in the width direction of the feeder mounting section 981. The arm members 983 are formed to, first, extend horizontally rearward, then, extend being inclined rearward and downward, and finally, extend horizontally rearward. The front bridge plate 984 is built across to link inclined parts of the two arm members 983 to each other. The rear bridge plate 985 is built across to link horizontal parts at the rear part of the two arm members 983.

The attachment device 99 is configured of a front bottom plate 991, a rear bottom plate 992, two side plates 993, an upper mounting rod 994, and a bottom section mounting rod 995 and the like. The front bottom plate 991 can be screwed to the inclined upper side of the front bridge plate 984. The rear bottom plate 992 can be screwed to the upper side of the rear bridge plate 985. Two side plates 993 stand upward from both ends in the width direction of the front bottom plate 991 and the rear bottom plate 992. In FIG. 2, the side plate 993 on the near front side of the paper surface is omitted. The upper mounting rod 994 is provided to be horizontal to the width direction to link the front upper parts of the two side plates 993 to each other. The bottom section mounting rod 995 is provided to be horizontal to the width direction to link the rear lower parts of the two side plates 993 to each other. The size in the width direction of the attachment device 99 is not limited, and the attachment devices 99 may be respectively individually provided for the multiple reel holding devices 1, and may be commonly provided for the plurality of reel holding devices 1.

In the mounting work of the reel holding device 1, an operator makes the reel holding device 1 advance toward the attachment device 99 from the rear part, and makes the upper mounting rod 994 engaged with the upper mounting groove 33. In addition, the operator returns the rear part of the reel holding device 1 slightly rearward while pressing the rear part, and makes the bottom section mounting rod 995 fitted to a far part of the hook-like bottom section mounting groove 35. The operator operates a lock member which is not illustrated, and fixes and mounts the reel holding device 1 to the attachment device 99. Then, the operator screws and fixes the attachment device 99 to the front bridge plate 984 and the rear bridge plate 985, and finishes the mounting work. In addition, as another method, a method of mounting the reel holding device 1 onto the attachment device 99 which is already fixed to the reel mounting section 982, may be employed.

As illustrated in FIG. 2, the reel holding device 1 is mounted at a position which is lower than the feeder mounting section 981. Accordingly, attachment and detachment work of the feeder device 9 is performed regardless of whether or not the reel holding device 1 or the attachment device 99 is mounted. Meanwhile, in a state where the feeder device 9 is mounted, any of exchange work of the attachment device 99 to which the reel holding device 1 is fixed, exchange work of only the reel holding device 1, and exchange work of only the component supply reels 81 and 82, is possible.

Therefore, in setup changing work when changing a plurality of types of components to be supplied by switching the type of the board to be produced, the attachment device 99 or the reel holding device 1 may be exchanged, and it is not necessary to attach or detach the feeder device 9.

After mounting the reel holding device 1, the operator draws out the first component storage tape 85 from the component supply reel 81 of the first reel holding section 4, and inserts the first component storage tape 85 into the tape insertion port 91 of the feeder device 9 through the rear side and the upper side of the deviation preventing roller 43. Next, the operator draws out the second component storage tape 86 from the component supply reel 82 of the second reel holding section 5, and inserts the second component storage tape 86 into the tape insertion port 91 of the feeder device 9 through the rear side and the upper side of the tape guide roller 54. Then, the two component storage tapes 85 and 86 are sent out while being in contact with the deviation preventing roller 43 and the tape guide roller 54 respectively, and are oriented toward the tape insertion port 91. As can be ascertained from the description, the deviation preventing roller 43 also functions as a tape guide member.

When the sending of the first component storage tape 85 is started by the feeder device 9, a sending-out force acts on the component storage tape 85 in the first reel holding section 4. Accordingly, the component storage tape 85 delivered to the feeder device 9 makes the component supply reel 81 float from the outer circumferential support rollers 41 and 42 and deviated. However, since the outer circumference of the component supply reel 81 abuts against the deviation preventing roller 43, the component supply reel 81 is prevented from deviating.

In addition, when the first component storage tape 85 is sent out to the final end and the components run out in a certain feeder device in the middle of producing the board, the operator detaches the component supply reel 81 from the first reel holding section 4, and moves the component supply reel 82 of the second reel holding section 5 to the first reel holding section 4. Next, the operator puts a new component supply reel 82 into the second reel holding section 5, and inserts the tip end of the new component storage tape 86 into the tape insertion port 91 of the feeder device 9. By repeating this, component replenishment work when the components run out is easily performed.

(4. Operation of Reel Holding Device 1 Compared to Related Art)

Figure 5:
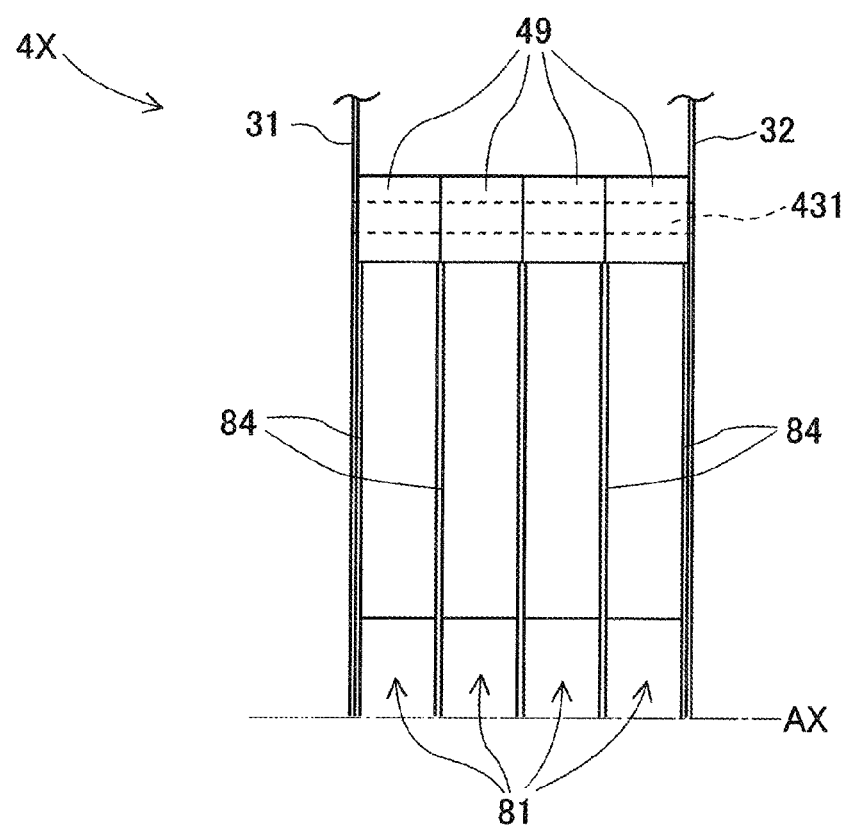
FIG. 5 is a plan view when a first reel holding section of the related art is viewed from above.

Next, an operation of the reel holding device 1 of the first embodiment will be described compared to the related art. FIG. 5 is a plan view when a first reel holding section 4X of the related art is viewed from above. In the related art, deviation preventing rollers 49 are individually provided in order to reduce friction when the component supply reel 81 rotates. In other words, four deviation preventing rollers 49 which are slightly longer than the separation distance D between the reel flanges 84 are aligned in the direction of the reel axial line, and are supported by the shaft member 431.

In this configuration, there is a concern that the reel flange 84 is meshed between the deviation preventing roller 49 and the side walls 31 and 32, or between the deviation preventing rollers 49. When the reel flange 84 is meshed, the component supply reel 81 floats up starting from the meshing position, the sending of the component storage tape 85 is interrupted, and excellent component supply is obstructed. Similarly, in the related art, the outer circumferential support rollers which are not illustrated are also individually provided in each of the component supply reels 81. Therefore, there is a concern that the reel flange 84 is meshed between the outer circumferential support rollers and the side walls 31 and 32, or between the outer circumferential support rollers. When the reel flange 84 is meshed and cannot freely rotate, the sending of the component storage tape 85 is interrupted, and excellent component supply is obstructed.

Meanwhile, in the reel holding device 1 of the first embodiment, the deviation preventing roller 43 is an integrated member, and thus, the reel flanges 84, 84M, and 84N cannot be meshed between the rollers. In addition, even when a void is generated between the deviation preventing roller 43 and the side walls 31 and 32, the diameter-reducing section 432 is provided in the deviation preventing roller 43, and thus, there is not a case where the reel flange 84N on the end part side is meshed with the void. The operation of preventing the reel flanges 84, 84M, and 84N from being meshed, is similarly generated in the front and rear outer circumferential support rollers 41 and 42. Therefore, the first reel holding section 4 can stably hold the four component supply reels 81 to be rotatable. Similarly, the second reel holding section 5 also can stably hold the four component supply reels 82 to be rotatable.

(5. Aspect and Effect of Reel Holding Device 1 of First Embodiment)

There is provided the reel holding device 1 of the first embodiment which is used being combined with the feeder device 9 that is capable of collecting components at the supply position 94 by sending out the component storage tapes 85 and 86 which store each of the components in multiple component storage sections, and holds the multiple component supply reels 81 and 82 around which the component storage tapes 85 and 86 are respectively wound to be rotatable and exchangeable, the device including: the case 2 which accommodates the multiple component supply reels 81 and 82 to be aligned in a direction of the reel axial line AX; the outer circumferential support rollers 41, 42, 51, and 52 which are built between the two sides walls 31 and 32 of the case 2, and support the outer circumferences of the multiple component supply reels 81 and 82 to be rotatable such that the reel axial lines AX are identical to each other; and the deviation preventing rollers 43 and 53 which are built between the two side walls 31 and 32, face outer circumferences of the multiple component supply reels 81 and 82, and prevent the component supply reels 81 and from deviating from the outer circumferential support rollers 41, 42, 51, and 52, in which the outer circumferential support rollers 41, 42, 51, and 52 and the deviation preventing rollers 43 and 53 are integrated rod-like members which have a smooth surface that abuts against the outer circumferences of the multiple component supply reels 81 and 82 and are built between the two side walls 31 and 32.

According to this, the outer circumferential support rollers 41, 42, 51, and 52 and the deviation preventing rollers 43 and 53 are integrated rod-like members which are built between the two side walls 31 and 32. Therefore, the multiple component supply reels 81 and 82 abut against the outer circumference of the integrated outer circumferential support rollers 41, 42, 51, and 52 and the deviation preventing rollers 43 and 53, and there is no concern that the reel flange 84 is meshed between the rollers as described in the related art. Therefore, the reel holding device 1 stably holds the component supply reels 81 and 82 to be rotatable, and reliably sends out the component storage tapes 85 and 86. In addition, the multiple deviation preventing rollers 49 provided in each of the component supply reels 81 and 82 in the related art are integrated deviation preventing roller 43, and similarly, the outer circumferential support rollers 41, 42, 51, and 52 are also an integrated member, and thus, the number of members is reduced, and cost reduction is achieved.

Furthermore, the outer circumferential support rollers 41, 42, 51, and 52 and the deviation preventing rollers 43 and 53 are freely rotatable rod-like roller members, and have the diameter-reducing section 432 whose width dimension W is wider than the thickness T of the reel flanges 84 that respectively form the component supply reels 81 and 82 at both of end parts, and is narrower than a separation distance D of the two reel flanges 84.

According to this, even when the void is generated between the outer circumferential support rollers 41, 42, 51, and 52 and the deviation preventing rollers 43 and 53, and the side walls 31 and 32, there is no concern that the reel flange 84N on the end section side is meshed with the void. This is because the component supply reels 81A and 81D near the end part are in a state where the reel flange 84N on the end part side floats to face the diameter-reducing section 432, and is received on one side only in the reel flange 84M on the center side or abuts against one side. Therefore, the reel holding device 1 can much more reliably hold the component supply reels 81 and 82 to be stably rotatable.

Furthermore, the outer circumferential support rollers 41, 42, 51, and 52 and the deviation preventing rollers 43 and 53 have the same shape. In addition, the shaft members 411, 421, 511, 521, 431, 531, and 541 which support the rollers 41, 42, 51, 52, 43, and 53 also have the same shape. Therefore, the number of types of the member is reduced, and cost reduction is achieved.

Furthermore, the deviation preventing roller 43 also functions as the tape guide member which guides the sending of the first component storage tape 85 to the feeder device 9. According to this, a feeding path of the component storage tape 85 is stabilized, and the component storage tape 85 is much more reliably sent out. In addition, since the dedicated tape guide member is not necessary, the number of members is reduced, and cost reduction is achieved.

Furthermore, the two outer circumferential support rollers 41 and 42 which support the lower part of the outer circumferences of the multiple component supply reels 81 to be rotatable, and the deviation preventing roller 43 which faces the upper part of the outer circumferences of the multiple component supply reels 81 are provided, and the reel putting-in/out section 44 which is provided at the separation distance that is greater than the outer diameter of the component supply reel 81 and can put in and out the component supply reel 81 is formed between the outer circumferential support roller 42 on the rear side and the deviation preventing roller 43. According to this, since it is possible to exchange only the component supply reel 81 without detaching the reel holding device 1 from the common pallet 98, and labor and time for the component replenishment work are reduced.

Furthermore, the first reel holding section 4 and the second reel holding section 5 configured of two outer circumferential support rollers 41, 42, 51, and 52 and the deviation preventing rollers 43 and 53 are provided, and the reel putting-in/out sections 44 and 55 are formed in each of the two groups of reel holding sections 4 and 5. According to this, by using the reel holding device 1 and the feeder device 9 unnecessary for the splicing work after combining the devices with each other, labor and time for the component replenishment work are further reduced.

(6. Specific Shape of First Reel Holding Section 4A of Second Embodiment)

Figure 6:
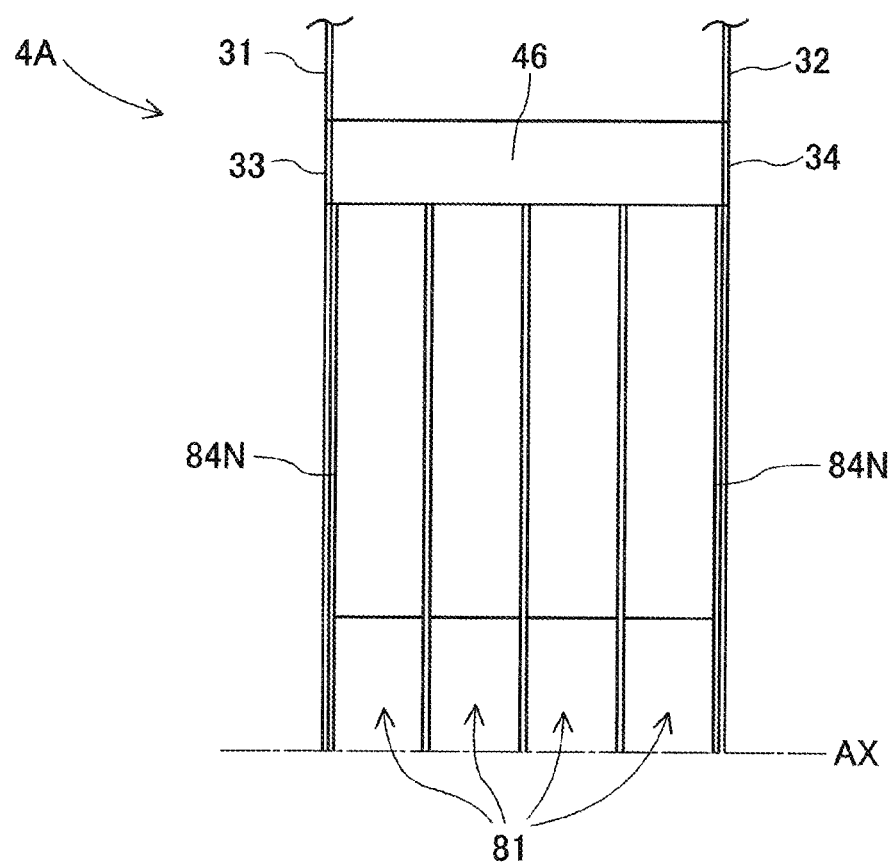
FIG. 6 is a plan view when a first reel holding section of a second embodiment is viewed from above.

Next, a reel holding device of the second embodiment will be described mainly focusing on difference from the first embodiment. A main configuration of the reel holding device of the second embodiment is similar to that of the first embodiment, and is configured of the case, a first reel holding section 4A, and a second reel holding section and the like. FIG. 6 is a plan view when the first reel holding section 4A of the second embodiment is viewed from above. In the second embodiment, instead of the deviation preventing roller 43 and the shaft member 431, a deviation preventing rod 46 is used.

The deviation preventing rod 46 is an integrated rod-like member having a constant outer diameter. Both of the end parts of the deviation preventing rod 46 are fitted and locked to locking holes 33 and 34 which are respectively drilled on both of the side walls 31 and 32. Therefore, the deviation preventing rod 46 does not rotate. In addition, there is not a case where a void is generated between the deviation preventing rod 46 and the side walls 31 and 32, and there is no concern that the reel flange 84N on the end part side is meshed unlike the related art.

In addition, in the first reel holding section 4A, instead of the outer circumferential support rollers 41 and 42, a reel holding rod having the same shape as that of the deviation preventing rod 46 is used. Furthermore, the deviation preventing rod 46 and the reel holding rod are also used in the second reel holding section. In other words, in the second embodiment, a void between the members with which the reel flange 84 is meshed, is eliminated. Therefore, the reel holding device of the second embodiment holds the component supply reels 81 and 82 to be stably rotatable, and reliably sends out the component storage tapes 85 and 86.

(7. Application and Deformation of Embodiments)

In addition, in the first embodiment, an aspect in which a recessed section or a hole section is provided in the two side walls 31 and 32, and both ends of the outer circumferential support rollers 41, 42, 51, and 52 and the deviation preventing rollers 43 and 53 which do not include the diameter-reducing section 432 go into the recessed part or the hole part to be rotatable may be employed. In addition, in the first and second embodiments, the number of reels which are respectively held by the first reel holding sections 4 and 4A and the second reel holding section 5, is not limited to 4, and can be changed from 2 to the total number of feeder devices 9. In addition, the number of attachment devices 99 which are fixed between two supporting boards 986 of the common pallet 98, or the number of reel holding devices 1 mounted on each of the attachment devices 99, can also be changed. Furthermore, corresponding to the feeder device which can perform the splicing work, a reel holding device only having the first reel holding sections 4 and 4A without providing the second reel holding section 5, can also be employed. In addition to this, the present disclosure can be applied or deformed in various manners.

REFERENCE SIGNS LIST

1: reel holding device, 2: case, 31, 32: side wall, 33: upper mounting groove, 35: bottom section mounting groove, 4, 4A: first reel holding section, 41, 42: outer circumferential support roller, 43: deviation preventing roller, 432: diameter-reducing section, 433: step section, 44: reel putting-in/out section, 46: deviation preventing rod, 5: second reel holding section, 51, 52: outer circumferential support roller, 53: deviation preventing roller, 54: tape guide roller, 55: reel putting-in/out section, 81, 81A to 81D, 82: component supply reel, 83: reel axis, 84, 84M, 84N: reel flange, 85, 86: component storage tape, 9: feeder device, 91: tape insertion port, 92: insertion lever, 93: feeding rail, 94: supply position, 95: tape control section, 98: common pallet, 981: feeder mounting section, 982: reel mounting section, 99: attachment device, 994: upper mounting rod, 995: bottom section mounting rod, 4X: first reel holding section of related art, 49: deviation preventing roller of related art

The invention claimed is:

1. A reel holding device configured for use with a feeder device that collects components at a supply position by sending out a component storage tape which stores each of the components in a plurality of component storage sections, and holds a plurality of component supply reels around which component storage tapes are respectively wound to be rotatable and exchangeable, the device comprising:
a case which accommodates the plurality of component supply reels to be aligned in a direction of a reel axial line;
outer circumferential support members between two sides walls of the case, that support outer circumferences of the plurality of component supply reels to be rotatable such that the reel axial lines are substantially rotational symmetric to each other; and
a deviation preventing member between the two side walls, that faces the outer circumferences of the plurality of component supply reels, and that prevents the component supply reels from deviating from the outer circumferential support members,
wherein at least one of the outer circumferential support members and the deviation preventing member is an integrated rod-like member which includes a smooth surface that abuts against the outer circumferences of the plurality of component supply reels and is between the two side walls, and
wherein the integrated rod-like member is a freely rotatable rod-like roller member, and includes a diameter-reducing section which is wider than a thickness of reel flanges that respectively form ends of the component supply reels, and that is narrower than a separation distance of the reel flanges.

2. The reel holding device according to claim 1, wherein the outer circumferential support members and the deviation preventing member are the integrated rod-like members having the same shape, or the rod-like roller members having the same shape.

3. The reel holding device according to claim 1, wherein the deviation preventing member guides the sending of the component storage tape to the feeder device.

4. A reel holding device configured for use with a feeder device that collects components at a supply position by sending out a component storage tape which stores each of the components in a plurality of component storage sections, and holds a plurality of component supply reels around which component storage tapes are respectively wound to be rotatable and exchangeable, the device comprising:
a case which accommodates the plurality of component supply reels to be aligned in a direction of a reel axial line;
outer circumferential support members between two sides walls of the case, that support outer circumferences of the plurality of component supply reels to be rotatable such that the reel axial lines are substantially rotational symmetric to each other; and
a deviation preventing member between the two side walls, that faces the outer circumferences of the plurality of component supply reels, and that prevents the component supply reels from deviating from the outer circumferential support members,
wherein at least one of the outer circumferential support members and the deviation preventing member is an integrated rod-like member which includes a smooth surface that abuts against the outer circumferences of the plurality of component supply reels and is between the two side walls, and
wherein two of the outer circumferential support members support a lower part of the outer circumferences of the plurality of component supply reels to be rotatable,
wherein the deviation preventing member faces an upper part of the outer circumferences of the plurality of component supply reels, and
wherein a reel putting-in/out section which puts in and out the component supply reel with a separation distance which is greater than an outer diameter of the component supply reel, is formed between any one of the outer circumferential support members and the deviation preventing member.

5. The reel holding device according to claim 4, further comprising:
two groups of the two outer circumferential support members, the deviation preventing member, and the reel putting-in/out section.

* * * * *